United States Patent [19]

Nakai et al.

[11] Patent Number: 5,098,769
[45] Date of Patent: Mar. 24, 1992

[54] TWO-SHOT MOLDED ARTICLE FOR USE IN CIRCUIT FORMATION

[75] Inventors: Mikio Nakai, Shizuoka; Yoshiharu Suzuki, Chiba, both of Japan

[73] Assignee: Polyplastics Co., Ltd., Osaka, Japan

[21] Appl. No.: 598,116

[22] Filed: Oct. 16, 1990

[30] Foreign Application Priority Data

Oct. 26, 1989 [JP] Japan .................................. 1-279041

[51] Int. Cl.⁵ .............................................. B32B 9/00
[52] U.S. Cl. .................... 428/195; 428/209; 428/323; 428/480; 361/397
[58] Field of Search ............. 428/209, 323, 480, 901; 361/397

[56] References Cited

U.S. PATENT DOCUMENTS

| | | | |
|---|---|---|---|
| 4,626,371 | 12/1986 | Ikenaga et al. | 252/62.54 |
| 4,632,798 | 12/1986 | Eickman et al. | 264/272.17 |
| 4,719,250 | 1/1988 | Eickman et al. | 523/212 |
| 4,720,424 | 1/1988 | Eickman et al. | 428/323 |
| 4,908,259 | 3/1990 | Yumoto | 428/209 |

FOREIGN PATENT DOCUMENTS 63-36633 7/1988 Japan .

*Primary Examiner*—Patrick J. Ryan
*Assistant Examiner*—Kam F. Lee
*Attorney, Agent, or Firm*—Burns, Doane, Swecker & Mathis

[57] ABSTRACT

An integrally molded article for use in circuit formation is provided by use of a two-shot injection molding procedure. A previously molded primary thermoplastic resin composition is pretreated for plating and a specifically defined secondary thermoplastic resin composition having a melt viscosity of 200 P. or below is injection molded about preselected portions of the primary molding which are not intended to bear a circuit. Such secondary thermoplastic resin composition comprises an anisotropic melt-forming polyester having a weight average molecular weight of 10,000 or below and a particulate inorganic filler. Excellent adhesion between the primary and secondary thermoplastic resins is achieved.

14 Claims, 2 Drawing Sheets

TWO-SHOT MOLDED ARTICLE FOR USE IN CIRCUIT FORMATION

BACKGROUND OF THE INVENTION

This invention relates to a molded article for use in circuit formation formed by using thermoplastic resin compositions as injection molding materials and molding these resins by two-shot injection molding.

A molded article for use in circuit formation formed by two-shot injection molding refers to a molded article formed by first forming a predetermined shape by the primary molding of a primary thermoplastic resin to give a molded article of the primary resin, subjecting the molded resin to etching and catalyst application as a pretreatment for plating, placing the pretreated article in a mold having a cavity which is in conformity with the entire shape of the molded article for use in circuit formation, filling the space with a secondary thermoplastic resin so as to leave the circuit formation portion of the primary molded article uncovered and integrally molding the secondary molding with the primary molding. The molded article thus formed is subjected to electroless plating to form a circuit on the uncovered area of the primary molded article, thus giving a final molded article having a circuit formed therein.

However, the adhesion between the molded article of the primary resin formed by the primary molding to that of the secondary resin formed by the secondary molding is usually so poor that problems arise when the plating solution penetrates through the interface between the primary and secondary molded articles during the electroless plating of the primary molded article after the two-shot molding so as to corrode the formed circuit or peeling occurs at the interface between the primary and secondary molded materials when the final product is used under severe conditions. These problems have been aided by improving the adhesion at the interface through improved resin flow obtained by elevating the cylinder temperature or the injection pressure of a molding machine during the secondary molding or by decreasing the differences in the mold shrinkage between the primary and secondary resins by preheating the molded primary resin to a temperature near the molding temperature of the secondary resin, setting it in the cavity, and performing the secondary molding.

However, these procedures have problems such as decreased mechanical strengths due to the degradation of the resin, breakage of the primary molded resin when subjected to the elevated injection pressure used in the secondary molding, and the deformation of the molded primary resin caused by the softening of the primary resin during heating. Even if the adhesion between the primary resin and the secondary resin is good and has no problem of air tightness just after being molded, there sometimes has been delamination caused by a heat hysteresis during a high-temperature/low-temperature cycle.

SUMMARY OF THE INVENTION

An improved integrally molded article for use in circuit formation is provided which is formed by a two-shot injection molding process wherein a secondary thermoplastic resin composition having a melt viscosity of 200 P. or below measured at 310° C. at a shear rate of 1,200 sec.$^{-1}$ comprising an anisotropic melt-forming polyester having a weight average molecular weight of 10,000 or below and a particulate inorganic filler is injection molded about preselected portions not intended to bear a circuit of a previously molded primary thermoplastic resin composition which has been pretreated for plating so as to achieve excellent adhesion between the primary thermoplastic resin composition and the secondary thermoplastic resin composition.

DESCRIPTION OF PREFERRED EMBODIMENTS

Figure 1A:
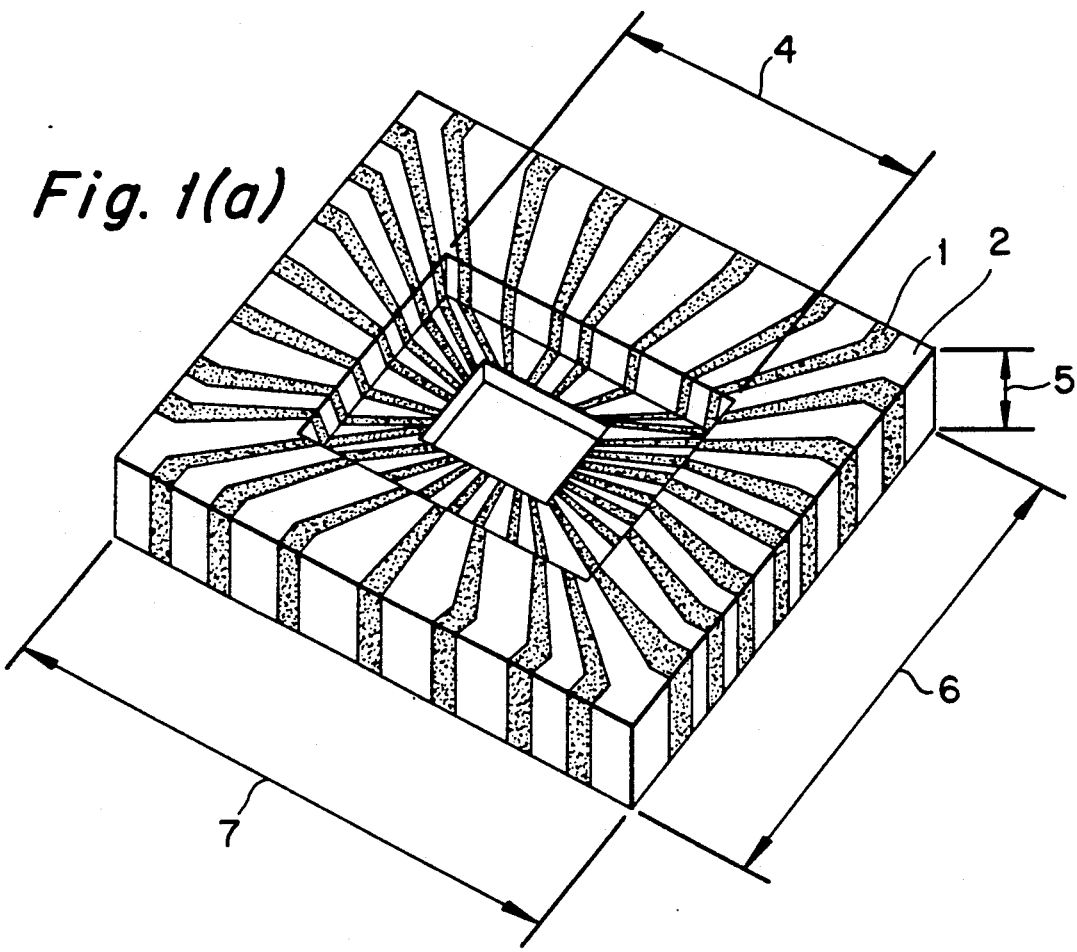
FIG. 1(a) is a perspective view of a two-shot molded article in accordance with the present invention prepared as described in the Examples where 1 is the exposed primary thermoplastic resin composition which has been pretreated for plating and 2 is the secondary thermoplastic resin composition. Dimension 4 measures 10 mm., dimension 5 measures 3 mm., and dimensions 6 and 7 each measure 20 mm.

With a view to solve the above-mentioned problems of the prior art, the present inventors have extensively studied to improve the interfacial adhesion between the molded primary resin and the molded secondary resin in a molded article for use in circuit formation formed by integrally molding a secondary thermoplastic resin with a molded article of a primary thermoplastic resin by two-shot injection molding. It has been found that a specified liquid crystal polyester resin composition of a very low melt viscosity, namely a melt processable polyester resin composition capable of forming an anisotropic molten phase, is a material well suited for use as the secondary thermoplastic resin. A molded article for use in circuit formation is produced having improved adhesion between the molded primary and secondary compositions which retains high adhesion even when it is subjected to the load of a high-temperature/ low-temperature heat shock cycle. In a preferred embodiment a silicone rubber and/or a thermoplastic elastomer is blended with the liquid crystal polyester of the secondary thermoplastic resin composition.

This invention provides a two-shot molded article for use in circuit formation formed by a two-shot injection molding process comprising integrally molding a secondary thermoplastic resin containing an inorganic filler with the molded article of a primary thermoplastic resin comprising an easily platable resin composition wherein there is excellent adhesion between the molded article of the primary thermoplastic resin composition and that of the secondary thermoplastic resin composition. A liquid crystal polyester resin composition comprising a liquid crystal polyester having a weight average molecular weight of 10,000 or below and having a melt viscosity (at a temperature of 310° C. and a shear rate of 1200 sec.$^{-1}$) of 200 P. or below is used as the secondary thermoplastic resin.

The secondary thermoplastic resin to be used in this invention is a liquid crystal polyester resin composition having a melt viscosity of 200 P. or below when measured at a temperature of 310° C. and a shear rate of 1200 sec.$^{-1}$, and preferably a composition having a melt viscosity of 50 to 200 P. When the melt viscosity exceeds 200 P., no perfect molding can be attained due to short shot, etc., while when it is below 50 P., the resin flows out of the tip of the nozzle of an injection molding machine to cause problems such as unstable metering.

In order to obtain the liquid crystal polyester resin composition of such a low melt viscosity in this invention, it is necessary to control the weight average molecular weight of the liquid crystal polyester resin, the amount of the inorganic filler added, etc. Namely, the liquid crystal polyester resin used should have a weight average molecular weight of 10,000 or below, and preferably 1,000 to 7,000. When the liquid crystal resin has a weight average molecular weight much above 10,000 short shot occurs, so that the molding must be conducted by elevating the resin temperature or the injection pressure, which sometimes leads to the degradation of the resin and the breakage of the primary molded article due to the elevated injection pressure. The molecular weight can be determined by gel permeation chromatography and other standard methods which do not involve the formation of polymer solutions, such as the determination of end groups by infrared spectroscopy of a compression-molded film. It is also possible to determine the molecular weight by applying a light scattering method to a solution of a polymer in pentafluorophenol.

The liquid crystal polyester resin material of the secondary resin to be used in this invention contains a particulate inorganic filler in such an amount as to retain the difficult platability of the resin and to give a melt viscosity of 200 P. or below when measured at a temperature of 310° C. and a shear rate of 1200 sec$^{-1}$. The particulate inorganic filler is not particularly limited and any fibrous, powdery or platy inorganic substance may be used according to the purpose.

Examples of the fibrous inorganic substances include inorganic fibrous substances such as glass fiber, carbon fiber, asbestos fiber, silica fiber, silica/alumina fiber, alumina fiber, zirconia fiber, boron nitride fiber, silicon nitride fiber, boron fiber and potassium titanate fiber.

Examples of the powdery inorganic substance include carbon black, graphite, silica, quartz powder, glass beads, glass balloons, glass powder, metal oxides such as iron oxide, ferrite, silicon carbide, silicon nitride and boron nitride.

Examples of the platy inorganic substance include mica and glass flakes.

These inorganic fillers may be used alone or in the form of a mixture of at least two of them.

Particulate inorganic fillers which are particularly preferred are fibrous inorganic substances and ground products thereof, and examples thereof include glass fiber and milled glass fiber. The amount of the inorganic filler is 80 percent by weight or below, and preferably 30 to 50 percent by weight. From the standpoint of a balance between platability and mechanical properties, milled glass fiber which is intermediate glass fiber and finely powdered glass is particularly desirable.

When using these inorganic fillers, it is desirable to use, if necessary, a binder or a surface treatment.

The liquid crystal polyester is a high-strength material having a self-reinforcing effect ascribable to its special molecular ordering and has a small dimensional distortion because of its low coefficient of linear expansion and low molding shrinkage. Further, it commonly has a heat resistance of at least 220 to 240° C. in spite of its low melt viscosity and good flow. Further, it is highly chemically stable, is inert to other materials and has been found to offer significant advantages when employed as the secondary thermoplastic resin composition. Thus, the liquid crystal polyester has been found to possess excellent properties when incorporated in the secondary thermoplastic resin Its adhesive properties can be further improved by adding a silicone-rubber and/or a thermoplastic elastomer thereto.

The polyorganosiloxane constituting the silicone rubber to be used in this invention may be one derived by replacing part of the methyl side chains and/or at least part of the chain terminals of, for example, dimethxylpolysiloxane by at least one substituent (other than the above reactive functional groups) such as alkyls, aryls, haloalkyls, haloaryls, amino-modified alkyls, mercapto-modified alkyls, epoxy-modified alkyls, carboxyl-modified alkyls or polyether-modified groups, alcohol-modified groups, ester-modified groups, or the like.

The silicon rubbers to be used in this invention are desirably powdery or particulate, and examples thereof include a millable silicone rubber formed by kneading an organopolysiloxane of a high degree of polymerization with an inorganic filler and a curing agent and crosslinking; the mixture by heat vulcanization, and a silicone rubber formed by crosslinking at least one organopolysiloxane having reactive groups by heating, ultraviolet radiation, or the like, in the presence of a catalyst.

Especially, a powdery or particulate addition type silicone rubber which can be crosslinked by the hydrosilylation addition reaction of an unsaturated group such as a vinyl group with

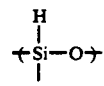

in the presence or a platinum compound catalyst is preferred. When selecting the powdery or particulate silicone rubber, one having a mean particle diameter of 0.1 to 100 μm is desirable, and one having a mean particle diameter of 1 to 20 μm is particularly preferred.

Although the thermoplastic elastomer to be used in this invention is not particularly limited as long as it has heat resistance and good dispersibility in the secondary resin and good compatibility with it, desirable examples thereof include ethylene/ethyl acrylate copolymers, maleic anhydride-grafted ethylene/ethyl acrylate copolymers, nylon 4,6 and polyamide resin elastomers. When other elastomers are used, it sometimes happens that the elastomers themselves are decomposed because they have poor heat resistance and the melting temperature of the secondary thermoplastic resin is high. Further, when an elastomer has poor compatibility though it has good heat resistance, it is not effective in improving the adhesion because of its poor state of dispersion.

The amount of the silicone rubber or the thermoplastic elastomer in this invention is preferably 0.1 to 10 percent by weight based on the total weight of the secondary thermoplastic resin composition and most preferably 1 to 5 percent by weight. When the silicone rubber and the thermoplastic elastomer are to be used together, it is desirable that the amount thereof not exceed 15 percent by weight based on the total weight of the composition.

Because the silicone rubber and the thermoplastic elastomer are added to the secondary thermoplastic resin of this invention not for the purpose of reacting with the secondary thermoplastic polyester, chemically inert materials are desirable. When the silicone rubber and thermoplastic elastomer are added to the liquid crystal polyester, the resulting composition forms a sea-island structure upon blending.

Further, the secondary thermoplastic resin composition of this invention may contain thermoplastic resins as an additional component in a minor concentration which do not interfere with the objects of the present invention.

The thermoplastic resins used in this event are not particularly limited and examples thereof include polyolefins such as polyethylene and polypropylene, polyacetals (homo- and co-polymers), polystyrene, polyvinyl chloride, polyacrylate and copolymers thereof, polycarbonate, ABS, polyphenylene oxide, polyphenylene sulfide and fluororesin. These thermoplastic resins may be used also in the form of a mixture of at least two of them.

It is also appropriate optionally to add well-known additives for thermoplastic and thermosetting resins, namely plasticizers, stabilizers such as antioxidants and ultraviolet absorbers, antistatic agents, surface treatments, surfactants, flame retardants, colorants such as dyes and pigments, parting agents and lubricating agents for improving flow and mold release characteristics, and crystallization accelerators (nucleating agents).

The primary thermoplastic resin to be used in this invention is an easily platable thermoplastic resin, and is not particularly limited so long as it is a thermoplastic resin which can be bonded to metal by plating and can be surface treated to have satisfactory adhesion to a plating metal. It may be suitably selected according to the use conditions intended for the resulting molded article Since the resulting molded article should possess solderability, durability, and good mechanical properties, it is preferable that the primary resin be heat-resistant, possess good mechanical strength, possess good dimensional stability, possess a coefficient of linear expansion very close to that of a metal, and not be subject to facile peeling of the plating metal.

Examples of the primary thermoplastic resin suitable for use in this invention from the above standpoint include liquid crystal polyesters (melt-processable polyesters which can exhibit an anisotropic melt phase), polysulfones, polyether sulfones, polyether imides, polyphenylene sulfides, and polyetherether ketones.

The liquid crystal polyesters are capable of forming a fine wire circuit because of their good moldability and they have excellent properties such as rigidity, heat distortion resistance and dimensional stability. Further they are materials which are the most preferred for use when forming the primary molded article of this invention in conjunction with the secondary molded article comprising a liquid crystal polyester thermoplastic resin.

A liquid crystal polyester used in this invention as the primary thermoplastic resin generally has a weight average molecular weight of about 2,000 to 200,000, preferably, about 10,000 to 50,000, and most preferably about 20,000 to 25,000. On the other hand, a suitable anisotropic melt-forming polyesteramide commonly has a molecular weight of about 5,000 to 50,000, preferably, about 10,000 to 30,000 (for example 15,000 to 17,000).

The above-mentioned anisotropic melt-forming polyesters commonly have an inherent viscosity (I.V.) of at least about 2.0 dl./g., for example, about 2.0 to 10.0 dl./g. when dissolved in pentafluorophenol at 60° C. in a concentration of 0.1 percent by weight.

A liquid crystal polyester is generally difficultly platable, and it is readily made platable so as to be used as the primary thermoplastic resin by adding to the resin at least one inorganic filler selected from the group consisting of the Group II elements of the periodic table, and oxides, sulfates, phosphates, silicates and carbonates thereof, aluminum, silica, tin, antimony, bismuth and oxides thereof, and palladium chloride.

Examples of the inorganic filler include oxides, such as magnesium oxide, calcium oxide, barium oxide and zinc oxide; magnesium phosphate; calcium phosphate; barium phosphate; zinc phosphate; magnesium pyrophosphate; calcium pyrophosphate; sulfates, such as barium sulfate; silicates, such as magnesium silicate, calcium silicate, aluminum silicate, kaolin, talc, clay, diatomaceous earth and wollastonite; magnesium carbonate; calcium carbonate; barium carbonate; and zinc carbonate.

It is also possible to add the above-mentioned fibrous, powdery, or platy particulate inorganic filler together with the above inorganic filler to the primary thermoplastic resin. A metallic fiber or foil can also be used. It is also possible to use the other thermoplastic resins, other additives, etc., used in the secondary thermoplastic resin composition.

The liquid crystal polyesters preferably used as both of the primary and the secondary thermoplastic resins in this invention are melt-processable polyesters which can assume a molten state in which the polymer molecular chains are regularly ordered in parallel. A state in which molecules are ordered like this is sometimes referred to as a liquid crystal state or a nematic phase of a liquid crystal substance. A molecule of such a polymer is generally long and flat, has a high rigidity along the major molecular axis and is usually composed of a plurality of chain extending bonds lying in a coaxial or parallel relation.

The nature of an anisotropic molten phase can be confirmed by the conventional polarization test performed by using crossed polarizers. More particularly, an anisotropic molten phase can be confirmed by using a Leitz polarization microscope and observing a molten sample mounted on a Leitz hot stage in a nitrogen atmosphere at a magnification of 30X. Even when the polymer of this invention is in a static molten state when observed between crossed polarizers, it can transmit polarized light and exhibits optical anisotropy.

The liquid crystal polymer suitable for use in this invention has a tendency toward being substantially insoluble in an ordinary solvent, so that it is unsuitable for solution processing. However, these polymers, as already mentioned, can be easily processed by the usual melt processing techniques.

The polymer which exhibits an anisotropic molten phase, used in this invention, is preferably a wholly aromatic polyester, or a wholly aromatic polyesteramide. A particularly preferred example is a liquid crystal aromatic polyester or aromatic polyesteramide containing as the constituent at least one compound selected from the group consisting of an aromatic hydroxy carboxylic acid, an aromatic hydroxy amine, and an aromatic diamine More particularly, examples thereof include (1) a polyester mainly consisting of at least one member selected from an aromatic hydroxy carboxylic acid and derivatives thereof, (2) a polyester mainly consisting of (a) at least one member selected from an aromatic hydroxy carboxylic acid and derivatives thereof, (b) at least one member selected from among an aromatic dicarboxylic acid, an alicyclic dicarboxylic acid and derivatives thereof, and (c) at least one member selected from among an aromatic diol, an alicyclic diol, an aliphatic diol and derivatives thereof, (3) a polyesteramide mainly consisting of (a) at least one member selected from an aromatic hydroxy carboxylic acid and derivatives thereof, (b) at least one member selected from among an aromatic hydroxy amine, an aromatic diamine and derivatives thereof, and (c) at least one member selected from among an aromatic dicarboxylic acid, an alicyclic dicarboxylic acid and derivatives thereof, and (4) a polyesteramide mainly consisting of (a) at least one member selected from an aromatic hydroxycarboxylic acid and derivatives thereof, (b) at least one member selected from among an aromatic hydroxy amine, an aromatic diamine and derivatives thereof, (c) at least one member selected from among an aromatic dicarboxylic acid, an alicyclic dicarboxylic acid and derivatives thereof, and (d) at least one member selected from among an aromatic diol, an alicyclic diol, an aliphatic diol, and derivatives thereof If necessary, a molecular weight modifier may be used together with the above constituents.

Desirable examples of particular reactants which form the liquid crystal polyester of this invention include naphthalene compounds such as 2,6-naphthalenedicarboxylic acid, 2,6-dihydroxynaphthalene, 1,4-dihydroxynaphthalene and 6-hydroxy2-naphthoic acid; biphenyl compounds such as 4,4'-diphenyldicarboxylic acid and 4,4'-dihydroxybiphenyl; compounds represented by the following general formulas (I), (II) and (III):

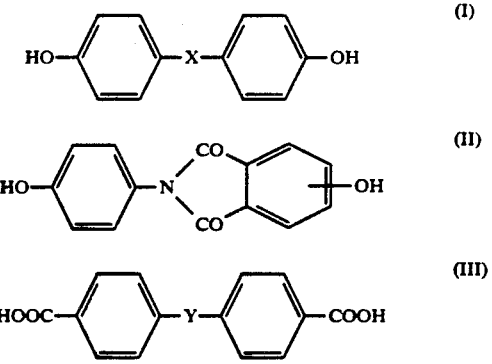

wherein
X is a group selected from among an alkylene ($C_1-C_4$), an alkylidene, —O—, —SO—, —SO$_2$—, S— and —CO—, and
Y is a group selected from —(CH$_2$)$_n$— (wherein n is 1 to 4) and —O(CH$_2$)$_n$O— (wherein n is 1 to 4),
p-substituted benzene compounds such as p-hydroxybenzoic acid, terephthalic acid, hydroquinone, p-aminophenol and p-phenylenediamine and ring-substituted derivatives thereof (wherein the substituent is selected from among chloro, bromo, methyl, phenyl and 1-phenylethyl); and m-substituted benzene compounds such as isophthalic acid and resorcinol.

The liquid crystal polyester used in this invention may contain, in addition to the abovementioned constituents, a polyalkylene terephthalate as part of the same molecular chain which does not exhibit any anisotropic molten phase. The number of carbon atoms of the alkyl group in this case is 2 to 4.

Preferred examples of the liquid crystal polyester are those containing, among the abovementioned constituents, at least one compound selected from among a naphthalene compound, a biphenyl compound and a p-substituted benzene compound as the essential component. Particularly preferred examples among the p-substituted benzene compounds are p-hydroxybenzoic acid, methylhydroquinone and 1-phenylethylhydroquinone.

Examples of the compounds having esterifiable functional groups as constituents and the preferred polyesters forming an anisotropic molten phase to be used in this invention are described in Japanese Patent Publication No. 36633/1988.

This invention relates to a two-shot molded article for use in circuit formation, which is formed by molding the secondary thermoplastic resin composition with the previously molded primary thermoplastic resin composition as above-mentioned and wherein the liquid crystal polyester of the secondary thermoplastic resin composition which contains a particulate inorganic filler, such as glass fiber, milled glass fiber or an inorganic powder has decreased anisotropy and yields a molded article having a very low coefficient of linear expansion which is generally the same in all directions regardless of the resin flow direction during molding and has good heat resistance and heat shock resistance.

When a silicone rubber and/or a thermoplastic elastomer are added to the liquid crystal polyester, the molded article of this invention has a decreased post shrinkage and an improved adhesion between the primary and secondary resins, and retains the reliability of a product for over an extended period of time.

The following examples are presented as specific illustrations of the claimed invention. It should be understood, however, that the invention is not limited to the specific details set forth in the examples.

EXAMPLES

Examples 1 to 10 and Comparative Examples 1 and 2

Figure 1B:
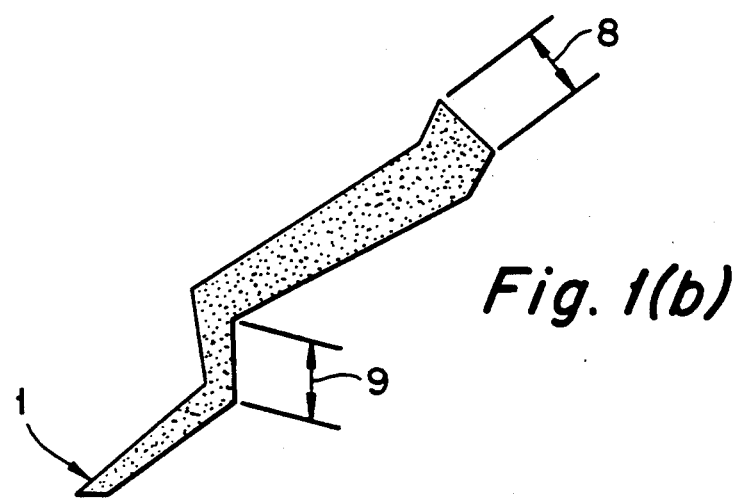
FIG. 1(b) is an enlarged view of an exposed portion of the primary thermoplastic resin composition 1 which has been pretreated for plating. This can be plated by electroless plating. Dimension 8 measures 0.5 mm. and dimension 9 measures 1 mm. p

Each of the following seven liquid polyester resins was mixed with a particulate inorganic filler, etc. in a compositional ratio as specified in Table 1 to form the primary thermoplastic resin composition or the secondary thermoplastic resin composition; the obtained compositions were pelletized at 300 to 320° C. in a usual manner; and these pellets were molded into the shapes shown in FIG. 1 by two-shot molding to evaluate the molded articles thus formed. The cylinder temperature of the injection molding machine used was set at 300° C. Table 1 gives the results of measurement.

The liquid crystal polyesters used in the Examples were those having the following structural units where the numbers represent molar ratios:

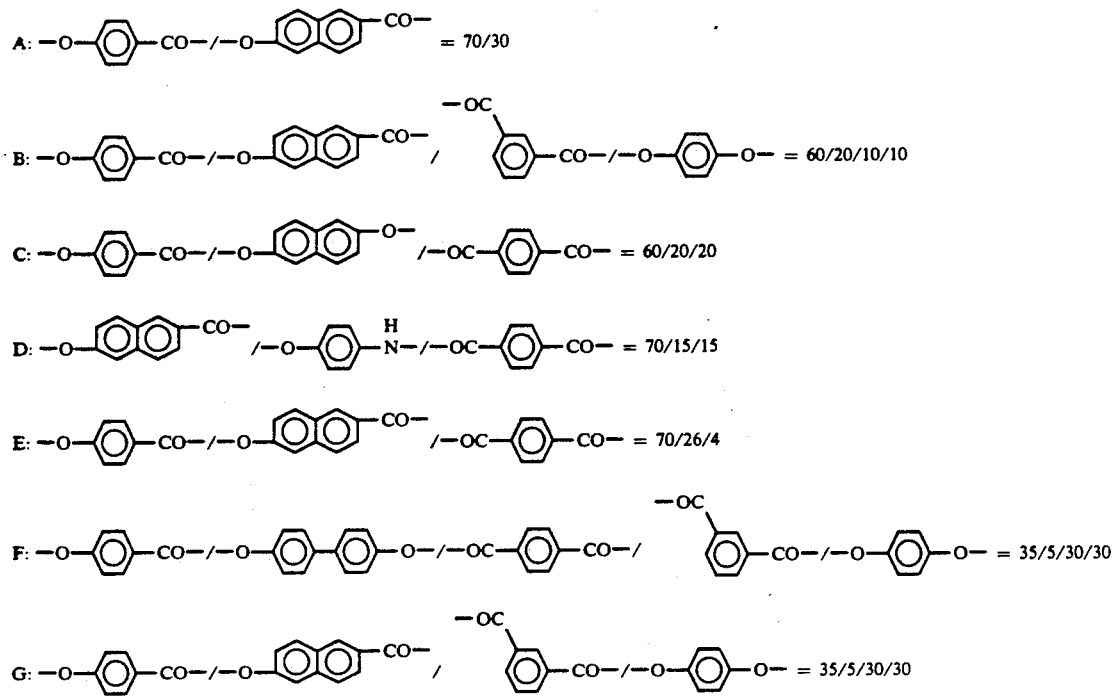

The silicone rubber A used here was a powdery (mean particle diameter of 8 μm) silicone rubber prepared by crosslinking a vinyldimethylpolysiloxane with a dimethylpolysiloxane having a

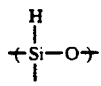

group by an addition reaction in the presence compound catalyst. The silicone rubber B was one derived by replacing part of the methyl groups of the silicone rubber A by epoxy groups.

The methods for the measurement of the properties described in the following Examples and the evaluation methods were as follows:

Measurement of Weight Averaqe Molecular Weight

A gel permeation chromatograph composed of a liquid feed pump, a sample injector, a high temperature thermostatic chamber, a separatory column, a differential refractive index detector (DRI), a small-angle laser beam scattering photometer, a personal computer for processing control, etc., were used to feed about 150 μl of a 0.1 wt. percent polymer solution prepared by dissolving pellets of a liquid crystal polyester resin composition in pentafluorophenol through the injector to the apparatus uniformly set at 60° C., separating the polymer fractions through a polystyrene gel treatment by utilizing the difference in molecular weight, sending the separated fractions to the DRI and processing the obtained data to determine the molecular weight.

Ink Penetration Test

A molded article shown in FIG. 1 was immersed in an ink solution (a methanolic solution of red ink) for 5 minutes to the depth of a half of the thickness of the article with the upper side thereof being directed upwards to observe the presence or absence of penetrated ink in the area of contact between the molded primary resin and the molded secondary resin at the recessed central part of the molded article under a microscope.

Gross Leak Test

Figure 2:
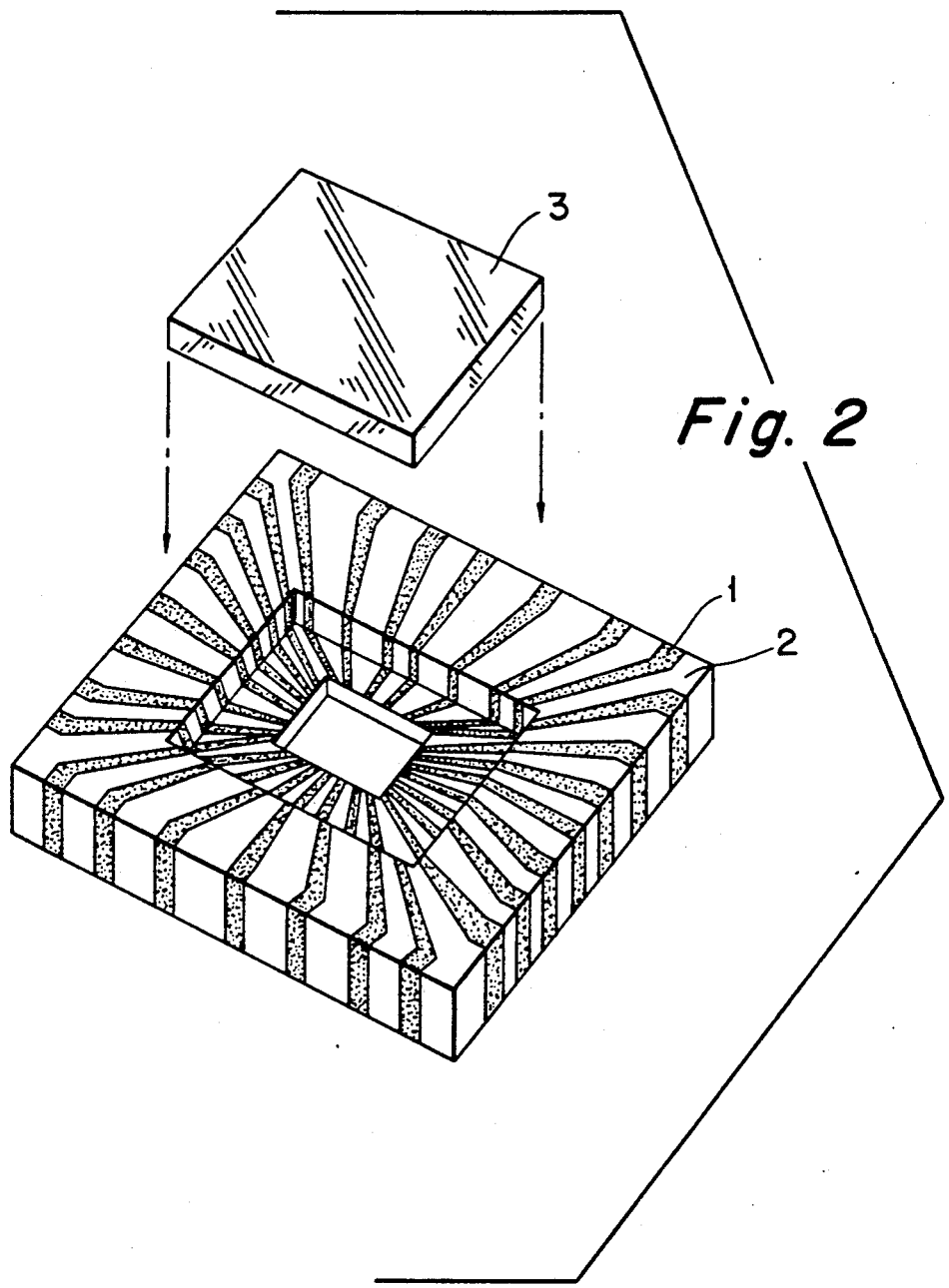
FIG. 2 is a perspective view illustrating the placement and removal of a glass lid upon the article during its formation as described in the Examples.

As shown in FIG. 2, the recess of a two-shot molded article of FIG. 1 was covered with a glass plate by using an epoxy adhesive and the covered article was immersed in an inert liquid (Fluorinert F40 liquid, a product of 3M) (at 125° C.) to evaluate the adhesion between the primary and secondary molded articles in terms of the emergence or nonemergence of bubbles from the area of contact between the primary and the secondary resin compositions and the time required for the first bubble to be recognized. Those instances where no bubble was recognized after immersion for 30 minutes was designated as "no".

A sample prepared by drying the same sample by heating at 150° C. for 1 hour and immersing it in a soldering bath at 260° C. for 10 seconds was subjected to the similar gross leak test. Those instances where no bubble was recognized after immersion for 10 minutes was taken as a measure of adhesion, and this state was designated as "no".

Examples 11 to 13

Molded articles were prepared for evaluation in the same manner as that of Examples 1 to 10 except that polyphenylene sulfide (PPS) or polyethylene terephthalate (PET) was used instead of the liquid crystal polyesters of Examples 1 to 10 when preparing the primary thermoplastic resin compositions listed in Table 2. Table 2 shows the results of the measurements.

Examples 14 to 21

Molded articles of the compositions specified in Table 3 were prepared for evaluation in the same manner as that of Examples 1 to 10 by using liquid crystal polyesters B, C and D as the primary thermoplastic resins and liquid crystal polyester A as the secondary thermoplastic resin. Table 3 gives the results of the measurements.

Comparative Example 3

Preparation of molded articles was attempted in the same manner as that of Examples 14 to 16 except that molecular weight was used as the secondary thermoplastic resin. However, the melt viscosity of the secondary resin composition was 691 P., so that the molding of the secondary resin was impossible.

Although the invention has been described with preferred embodiments it is to be understood that variations and modifications may be employed without departing from the concept of the invention as defined in the following claims.

TABLE 1

| | | Ex. 1 | Ex. 2 | Ex. 3 | Ex. 4 | Ex. 5 | Ex. 6 | Ex. 7 | Ex. 8 | Ex. 9 | Ex. 10 | Comp. Ex. 1 | Comp. Ex. 2 |
|---|---|---|---|---|---|---|---|---|---|---|---|---|---|
| Primary composition | liquid crystal polyester (wt %) (MW = 25000) | A 50 | A 50 | A 50 | A 50 | A 50 | A 50 | A 50 | A 50 | A 50 | A 50 | A 50 | A 50 |
| | milled glass fiber (wt %) | 15 | 15 | 15 | 15 | 15 | 15 | 15 | 15 | 15 | 15 | 15 | 15 |
| | calcium pyrophosphate (wt %) | 35 | 35 | 35 | 35 | 35 | 35 | 35 | 35 | 35 | 35 | 35 | 35 |
| Secondary composition | liquid crystal polyester (wt %) (MW = 3500) | A 45 | A 45 | B 45 | C 45 | D 45 | E 45 | F 45 | G 45 | A 50 | B 50 | A 100 | B 100 |
| | milled glass fiber (wt %) | 50 | 50 | 50 | 50 | 50 | 50 | 50 | 50 | 50 | 50 | — | — |
| | silicone rubber A (wt %) | 5 | — | 5 | 5 | 5 | 5 | 5 | 5 | — | — | — | — |
| | silicone rubber B (wt %) | — | 5 | — | — | — | — | — | — | — | — | — | — |
| | melt viscosity of resin composition (P.) | 100 | 120 | 108 | 121 | 112 | 123 | 109 | 118 | 98 | 101 | 48 | 50 |
| Properties | moldability | yes | yes | yes | yes | yes | yes | yes | yes | yes | yes | yes | yes |
| | ink penetration test | no | no | no | no | no | no | no | no | no | no | yes | yes |
| | gross leak test (time required for the first bubble to be recognized: min) | no | no | no | no | no | no | no | no | 20 | 20 | ≦1 | ≦1 |
| | gross leak test after immersion in soldering bath (time required for the first bubble to be recognized: min) | no | no | no | no | no | no | no | no | ≦10 | ≦10 | ≦1 | ≦1 |

TABLE 2

| | | Ex. 11 | Ex. 12 | Ex. 13 |
|---|---|---|---|---|
| Primary composition | thermoplastic resin (wt %) | PPS 60 | PPS 40 | PET 50 |
| | milled glass fiber (wt %) | 40 | 60 | 30 |
| | calcium pyrophosphate (wt %) | — | — | 20 |
| Secondary composition | liquid crystal polyester (wt %) (MW = 3500) | A 50 | A 45 | A 45 |
| | milled glass fiber (wt %) | 50 | 50 | 50 |
| | silicone rubber A (wt %) | — | 5 | 5 |
| | silicone rubber B (wt %) | — | — | — |
| | melt viscosity of resin composition (P.) | 98 | 101 | 101 |
| Properties | moldability | yes | yes | yes |
| | ink penetration test | no | no | yes |
| | gross leak test (time required for the first bubble to be recognized: min) | 20 | no | no |
| | gross leak test after immersion in soldering bath (time required for the first bubble to be recognized: min) | ≦10 | no | no | liquid polyester A of a high 25,000 weight average

TABLE 3

| | | Ex. 14 | Ex. 15 | Ex. 16 | Ex. 17 | Ex. 18 | Ex. 19 | Ex. 20 | Ex. 21 |
|---|---|---|---|---|---|---|---|---|---|
| Primary composition | liquid crystal polyester (wt %) (MW = 25000) | B 50 | C 50 | D 50 | B 50 | B 50 | B 50 | B 50 | B 50 |
| | milled glass fiber (wt %) | 15 | 15 | 15 | 15 | 15 | 15 | 15 | 15 |
| | calcium pyrophosphate (wt %) | 35 | 35 | 35 | 35 | 35 | 35 | 35 | 35 |
| Secondary composition | liquid crystal polyester (wt %) (MW = 7000) | A 65 | A 65 | A 65 | A 65 | A. 65 | A 65 | A 65 | A 65 |
| | milled glass fiber (wt %) | 30 | 30 | 30 | 30 | 30 | 30 | 30 | 30 |
| | silicone rubber A (wt %) | 5 | 5 | 5 | — | — | — | — | — |
| | silicone rubber B (wt %) | — | — | — | 5 | — | — | — | — |
| | maleic anhydride-grafted ethylene/ethyl acrylate (wt %) | — | — | — | — | 5 | — | — | — |
| | ethylene/ethyl acrylate (wt %) | — | — | — | — | — | 5 | — | — |
| | nylon 4,6 (wt %) | — | — | — | — | — | — | 5 | — |
| | polyamide elastomer (wt %) | — | — | — | — | — | — | — | 5 |
| | melt viscosity of resin composition (P.) | 52 | 52 | 52 | 54 | 78 | 80 | 50 | 53 |
| Properties | moldability | yes | yes | yes | yes | yes | yes | yes | yes |
| | ink penetration test | no | no | no | no | no | no | no | no |

TABLE 3-continued

|  | Ex. 14 | Ex. 15 | Ex. 16 | Ex. 17 | Ex. 18 | Ex. 19 | Ex. 20 | Ex. 21 |
|---|---|---|---|---|---|---|---|---|
| gross leak test (time required for the first bubble to be recognized: min) | no | no | no | no | no | no | no | no |
| gross leak test after immersion in soldering bath (time required for the first bubble to be recognized: min) | no | no | no | no | no | no | no | no |

We claim:

1. An integrally molded article for use in circuit formation formed by a two-shot injection molding process wherein a secondary thermoplastic resin composition having a melt viscosity of 200 P. or below measured at 310° C. at a shear rate of 1,200 sec.$^{-1}$ comprising an anisotropic melt-forming polyester having a weight average molecular weight of 10,000 or below and a particulate inorganic filler in a concentration not exceeding 80 percent by weight of said composition selected from the group consisting of the Group II elements of the periodic table, and oxides, sulfates, phosphates, silicates and carbonates thereof, aluminum, silica, tin, antimony, bismuth and oxides thereof, palladium chloride, glass fiber, milled glass fiber, finely powdered glass, and mixtures of the foregoing, is injection molded about preselected portions not intended to bear a circuit of a previously molded primary thermoplastic resin composition which has been pretreated for plating so as to achieve excellent adhesion between the primary thermoplastic resin composition and the secondary thermoplastic resin composition.

2. An integrally molded article for use in circuit formation formed by a two-shot injection molding process according to claim 1 wherein said primary thermoplastic resin is selected from the group consisting of an anisotropic melt-forming polyester, polysulfone, polyether sulfone, polyether imide, polyphenylene sulfide, and polyetheretherketone.

3. An integrally molded article for use in circuit formation formed by a two-shot injection molding process according to claim 1 wherein said primary thermoplastic resin composition and said secondary thermoplastic resin composition each comprise an anisotropic melt-forming polyester.

4. An integrally molded article for use in circuit formation formed by a two-shot injection molding process according to claim 1 wherein said anisotropic melt-forming polyester of said secondary thermoplastic resin composition exhibits an inherent viscosity of at least 2.0 dl./g. when dissolved in pentafluorphenol in a concentration of 0.1 percent by weight at 60° C.

5. An integrally molded article for use in circuit formation formed by a two-shot injection molding process according to claim 1 wherein said anisotropic melt-forming polyester of said secondary thermoplastic resin composition exhibits an inherent viscosity of 2.0 to 10.0 dl./g. when dissolved in pentafluorophenol in a concentration of 0.1 percent by weight at 60° C.

6. An integrally molded article for use in circuit formation formed by a two-shot injection molding process according to claim 1 wherein said anisotropic melt-forming polyester of said secondary thermoplastic resin composition is a wholly aromatic polyester.

7. An integrally molded article for use in circuit formation formed by a two-shot injection molding process according to claim 1 wherein said anisotropic melt-forming polyester of said secondary thermoplastic resin composition is a wholly aromatic polyesteramide.

8. An integrally molded article for use in circuit formation formed by a two-shot injection molding process according to claim 1 wherein said anisotropic melt-forming polyester of said secondary thermoplastic resin composition includes recurring naphthalene moieties.

9. An integrally molded article for use in circuit formation formed by a two-shot injection molding process according to claim 1 wherein said anisotropic melt-forming polyester of said secondary thermoplastic resin composition comprises approximately 70 mole percent of recurring 4-oxybenzoyl moieties and approximately 30 mole percent of 6-oxy-2-naphthoyl moieties.

10. An integrally molded article for use in circuit formation formed by a two-shot injection molding process according to claim 1 wherein said primary thermoplastic resin composition includes a particulate inorganic filler 11. An integrally molded article for use in circuit formation formed by a two-shot injection molding process according to claim 1 wherein said anisotropic melt-forming polyester of said secondary thermoplastic resin composition has a weight average molecular weight 1,000 to 7,000 and a melt viscosity of 50 to 200 P. measured at 310° C. and a shear rate of 1,200 sec.$^{-1}$.

12. An integrally molded article for use in circuit formation formed by a two-shot injection molding process according to claim 1 wherein said secondary thermoplastic resin composition comprises 0.1 to 10.0 percent by weight based upon the total weight of said composition of silicone rubber and/or a thermoplastic elastomer.

13. An integrally molded article for use in circuit formation formed by a two-shot injection molding process according to claim 12 wherein said thermoplastic elastomer is selected for the group consisting an ethylene/ethyl acrylate copolymer resin, a maleic anhydride-grafted ethylene/ethyl acrylate copolymer resin, nylon 4,6, and polyamide resin elastomers.

14. An integrally molded article for use in circuit formation formed by a two-shot injection molding process according to claim 1 wherein said particulate inorganic filler is present in said secondary thermoplastic resin composition in a concentration of 30 to 50 percent by weight of said composition.

* * * * *